(12) United States Patent
Hempenius et al.

(10) Patent No.: US 8,928,860 B2
(45) Date of Patent: Jan. 6, 2015

(54) LITHOGRAPHIC APPARATUS HAVING A CHUCK WITH A VISCO-ELASTIC DAMPING LAYER

(75) Inventors: Peter Paul Hempenius, Nuenen (NL); Dirk-Jan Bijvoet, Eindhoven (NL); Youssef Karel Maria De Vos, Lille (BE); Ramidin Izair Kamidi, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 875 days.

(21) Appl. No.: 12/370,741

(22) Filed: Feb. 13, 2009

(65) Prior Publication Data

US 2009/0231567 A1 Sep. 17, 2009

Related U.S. Application Data

(60) Provisional application No. 61/064,199, filed on Feb. 21, 2008.

(51) Int. Cl.
*G03B 27/58* (2006.01)
*G03B 27/68* (2006.01)
*G03F 7/20* (2006.01)

(52) U.S. Cl.
CPC .......... *G03F 7/7095* (2013.01); *G03F 7/70783* (2013.01); *G03F 7/707* (2013.01)
USPC ............................................. 355/72; 355/52

(58) Field of Classification Search
USPC ........... 355/30, 52, 53, 55, 72–76; 250/492.2, 250/492.22, 548; 378/34, 35
See application file for complete search history.

(56) References Cited

U.S. PATENT DOCUMENTS

| | | | |
|---|---|---|---|
| 5,118,562 A * | 6/1992 | Johnson et al. | 428/327 |
| 5,191,218 A | 3/1993 | Mori et al. | |
| 5,256,223 A * | 10/1993 | Alberts et al. | 156/71 |
| 5,271,142 A * | 12/1993 | Moore et al. | 29/469.5 |
| 6,266,133 B1 * | 7/2001 | Miyajima et al. | 355/72 |

(Continued)

FOREIGN PATENT DOCUMENTS

CN 201017175 Y 2/2008
JP 04-071215 3/1992

(Continued)

OTHER PUBLICATIONS

English language translation of JP 08-25717 A.*

(Continued)

*Primary Examiner* — Toan Ton
*Assistant Examiner* — Mona M Sanei
(74) *Attorney, Agent, or Firm* — Pillsbury Winthrop Shaw Pittman LLP

(57) ABSTRACT

A lithographic apparatus includes an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, a chuck configured to hold and position an object, for example, the patterning device onto the support or the substrate onto the substrate table, the chuck including a base and a constraining layer. A damping layer including a viscoelastic material is provided between the base and the constraining layer.

25 Claims, 2 Drawing Sheets

(56) References Cited

U.S. PATENT DOCUMENTS

| | | | |
|---|---|---|---|
| 6,377,420 B1 * | 4/2002 | Tadepalli et al. | 360/97.02 |
| 6,836,531 B2 | 12/2004 | Hara et al. | |
| 2004/0084633 A1 * | 5/2004 | Moffatt | 250/492.2 |
| 2005/0095392 A1 * | 5/2005 | Boss | 428/68 |
| 2005/0128462 A1 * | 6/2005 | Matsui | 355/72 |
| 2007/0242245 A1 | 10/2007 | Wijckmans et al. | |

FOREIGN PATENT DOCUMENTS

| | | | |
|---|---|---|---|
| JP | 05-047909 | | 2/1993 |
| JP | 08257170 A | * | 10/1996 |
| JP | 9306834 A | | 11/1997 |
| JP | 1255223 A | | 9/2001 |
| JP | 20046706 A | | 1/2004 |
| JP | 2006-086162 | | 3/2006 |
| JP | 200759580 A | | 3/2007 |
| JP | 2007279733 A | | 10/2007 |
| JP | 2007281462 A | | 10/2007 |

OTHER PUBLICATIONS

Office Action in related Japanese application No. 2009-030675 mailed May 23, 2011.

Office Action in related Chinese Application No. 200910007195.1 issued Nov. 15, 2010.

Japanese Office Action mailed Oct. 4, 2011 in corresponding Japanese Patent Application No. 2009-030675.

Taiwan Office Action dated Apr. 24, 2013 in corresponding Taiwan Patent Application No. 098105310.

* cited by examiner

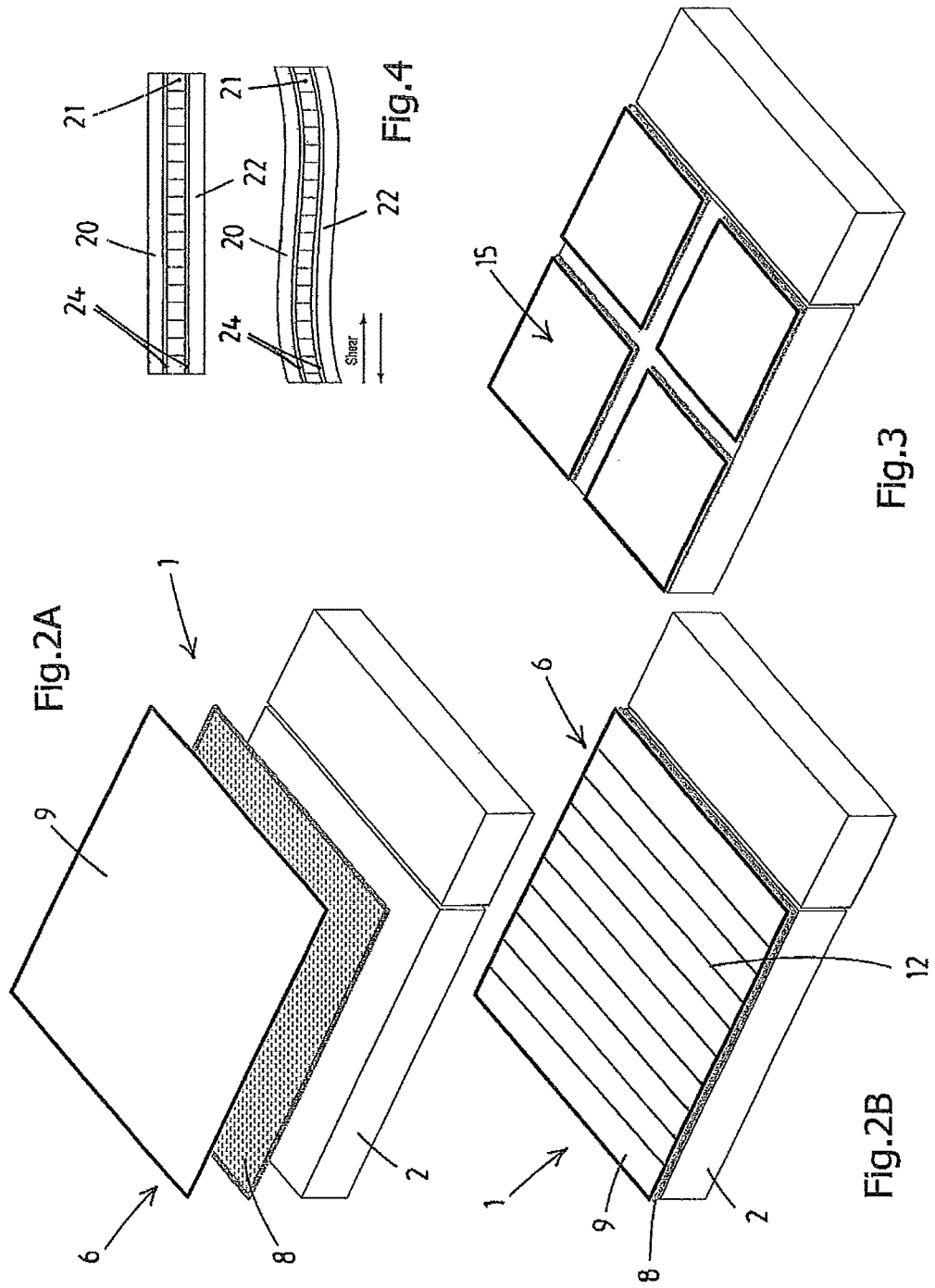

LITHOGRAPHIC APPARATUS HAVING A CHUCK WITH A VISCO-ELASTIC DAMPING LAYER

CROSS REFERENCE TO RELATED APPLICATIONS

This application claims priority and benefit under 35 U.S.C. §119(e) to U.S. Provisional Patent Application No. 61/064,199, entitled "A Lithographic Apparatus Having A Chuck With A Visco-Elastic Damping Layer," filed on Feb. 21, 2008. The content of that application is incorporated herein in its entirety by reference.

FIELD

The present invention relates to a lithographic apparatus and a chuck for use in such a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A chuck may be used as part of a patterning device stage to hold and position the patterning device, on a corresponding support of the patterning device stage. Chucks are also used as part of a substrate stage to hold and position the substrate, on a corresponding table of the substrate stage. As the patterns to be transferred from the patterning device towards the substrate grow increasingly smaller, the demands on the various components of the lithographic apparatus increase. Specifically, the chuck positioning tolerances decrease, which has a direct impact on the positioning control systems for the stages.

To propel and position an object, like for example a patterning device, weighing no more than 0.5 kilograms, typically a chuck of about 10-15 kilograms is desired. For such a chuck, it is desirable to use a stage weighing about one thousand kilograms to accurately propel and position the patterning device. In order to achieve a high throughput at a reasonable cost, the weight of the chuck may be reduce. For example, the chuck may be constructed as a glass block having a box structure with ribs inside. The obtained lightweight chuck enables lighter components across the entire stage, significantly reducing costs and increasing throughput.

However, in general, such ultra-light weight structures with high natural frequencies contain very poor damping behaviour. This poor damping inhibits optimum high stage servo bandwidths.

SUMMARY

It is desirable to improve stage servo bandwidths so that overlay and fading may be pushed further to the physical limits. At the same time, it is desirable that the throughput be further increased. More particularly, it is desirable to construct chucks as ultra-light weight structures with high natural frequencies and good damping behaviour.

According to an embodiment of the invention, there is provided a lithographic apparatus including an illumination system configured to condition a radiation beam; a patterning device support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a chuck configured to hold and position the patterning device onto the patterning device support or the substrate onto the substrate table, the chuck including a base and a constraining layer connected therewith, and wherein a damping layer including a viscoelastic material is provided between the base and the constraining layer.

In another embodiment of the invention, there is provided a chuck configured to hold and position an object in general, the chuck including a base and a constraining layer connected therewith, wherein a damping layer including a viscoelastic material is provided between the base and the constraining layer.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2a schematically shows an exploded view of the chuck according to an embodiment of the invention with a base, a viscoelastic damping layer and a constraining layer;

FIG. 2b is a view corresponding to FIG. 2a with the base, the viscoelastic damping layer and the constraining layer adhered together;

FIG. 3 schematically shows a chuck according to an embodiment of the invention with segmented layers; and FIG. 4 schematically shows a chuck according to an embodiment of the invention with a stack of a first constraining layer, viscoelastic damping layer and second constraining layer to be mounted onto a base part, both in a non-deformed state and in a deformed state.

DETAILED DESCRIPTION

Figure 1:
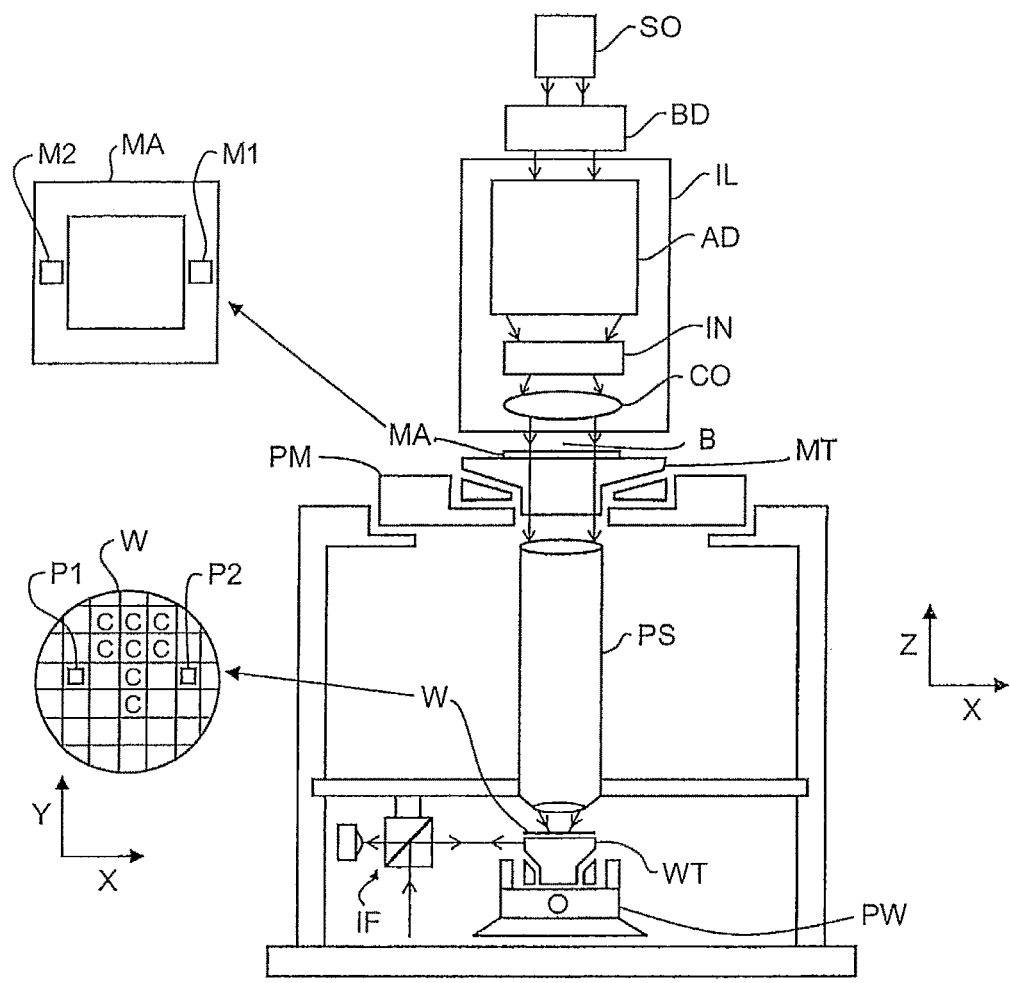
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g. mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In FIGS. 2-5, a chuck 1 is schematically shown which may typically be used in a lithographic apparatus, for example as shown in FIG. 1. The chuck 1 is configured to hold a patterning device on the patterning device support (e.g. mask table) MT, or a substrate on the substrate table WT. The chuck may also be used to hold and position another object, such as a mirror, within the lithographic apparatus. The chuck 1 includes a base 2 which may be made out of a glass material. The base 2 is constructed lightweight as a box with internal ribs. Furthermore, the chuck 1 includes a stack 6 of a damping layer 8 and a constraining layer 9 which may be made Out of a glass material. This stack 6 is connected to the base 2, using, for example, a suitable adhesive. The respective layers of the stack 6 are connected to each other, in particular also by means of a suitable adhesive. The stack 6 is configured to add damping to those modes where the interfacing base surface experiences high strain relative to the constraining layer 9, causing high shear in the (viscous) damping layer 8.

According to an embodiment of the invention, the damping layer 8 includes a viscoelastic material, in particular a viscoelastic polymer layer, for example a rubber. In FIG. 2, the viscoelastic damping layer 8 as well as the constraining 9 extend over substantially the entire upper side of the base 2. However, it will be appreciated that it is not necessary for the layers to cover the entire upper side of the base 2. For example, in an embodiment, more than half the surface (but less than the entire surface) of the base that experiences relatively high strain in the mode shape that is to be damped is covered.

The construction with the stack 6 of the constraining layer 9 and the viscoelastic damping layer 8 gives the base 2 both stiffness, high eigenfrequencies as well as proper damping characteristics. The entire construction of the chuck 1 is now both lightweight and resistant to bending while at the same time having a good damping behaviour and thus making it possible to further optimize the servo bandwidths. The viscoelastic damping layer 8 makes it possible to take up and damp relative deformation differences between the base surface and the constraining layer surface. This loads the damping layer with shear, for which it has high damping properties. With this technique global bending modes, but also local plate modes can be damped. Furthermore, local plate modes that occur above the folding frequency (which is half the sample frequency), may be folded back to a frequency range that limits servo bandwidths.

The viscoelastic damping layer 8 can have a thickness between about 100-1000 mu. In an embodiment, the viscoelastic damping layer 8 is approximately 200 mu thick. The constraining layer 9 can have a thickness between about 0.5-5 mm. The constraining layer 9 is approximately 1 mm thick. The base 2 can have a thickness between about 40-70 mm. In an embodiment, the base 2 is approximately 55 mm thick, of which the internal ribs 4 may have a thickness between 2-6 mm, and in particular be approximately 3 mm thick.

The elasticity modulus of the constraining layer 9 preferably is at least 10 times higher than the elasticity modulus of the viscoelastic damping layer 8. If an adhesive is used to connect the layers, then the elasticity modulus of the constraining layer 9 preferably is higher than the elasticity modulus of the adhesive, which in turn preferably is higher than the elasticity modulus of the viscoelastic damping layer 8. It is desirable that the shear module of the adhesive be sufficiently high to be able to load the viscoelastic damping layer 8 during damping.

The constraining layer 9 here can be provided with longitudinal cuts 12 in its top face. Preferably the cuts 12 extend through the entire thickness of the layer 9. If desired the cuts may also extend to some extent into the viscoelastic damping layer 8. The cuts 12 help to prevent drift of the chuck 1 due to relaxation and/or creep of the viscoelastic damping layer 8. For example, this may be beneficial during the connecting of the respective layers with each other using a hot melt adhesive, but also to prevent chuck deformation due to temperature variations during operation.

As shown in FIG. 3 it is also possible to have a number of segments 15 each including a stack of a damping layer and constraining layer. The segments 15 here cover only the most crucial parts of the base, in particular each segment 15 covers surfaces that show high strain in the mode shapes that are supposed to be damped. This already beneficially improves first order torsion and bending behaviour of the entire chuck thus formed. In particular, the (segments of the) viscoelastic damping layer and constraining layer at least cover half the upper side of the base surface with relative high strain.

As shown in FIG. 4, it is also possible to construct a stack of a first upper constraining layer 20, a viscoelastic damping layer 21 and a second lower constraining layer 22, which layers are connected to each other using an adhesive 24, in which the stack is destined to form a chuck together with a base (not shown) to which the stack is to be connected. Also in that case the viscoelastic damping layer 21 can take up a suitable amount of shear deformations between the base and the stack of layers.

Besides the embodiments shown, it will be appreciated that numerous variant embodiments are possible. For example, chucks according to the present invention may also be used in lithographic tools that do not contain projection optics, such as a contact lithographic tool, in maskless lithographic tools, as well as in lithographic tools with projection optics designs substantially different from this example. Instead of connecting a stack of a constraining layer-viscoelastic damping layer and possibly another constraining layer on top of the base part, it is also possible to directly connect a constraining layer, for example a glass lid, onto a base part by means of a viscoelastic adhesive. In that case the viscoelastic adhesive forms the viscoelastic damping layer which can take up a suitable amount of shear deformations between the base and the constraining layer.

Instead of glass, the base and/or constraining layers may also be formed out of other materials, like for example a ceramic material, or a suitable metal. The base may also be constructed lightweight in another manner, for example by means of another type of open structure, like including a plurality of pins with hollows there between. The viscoelastic damping layer may also be formed out of other materials, like for example a two-sided adhering viscoelastic foil.

In addition to or instead of providing the invention at the upper side of a base part of a chuck, the assembly of viscoelastic damping layer and constraining layer(s) may also be positioned at other sides of the base part.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a patterning device support constructed to support a patterning device, the patterning device being capable of imparting a radiation beam with a pattern in a cross-section of the radiation beam to form a patterned radiation beam;
   a substrate table constructed to hold a substrate;
   a projection system configured to project the patterned radiation beam onto a target portion of the substrate;
   a chuck configured to hold and position an object, the chuck comprising a base and a constraining layer, and
   a damping layer comprising a viscoelastic material and provided between the base and the constraining layer, wherein at least one of the damping layer and constraining layer is segmented in a plane thereof to form at least two detached segments in said at least one of the damping layer and the constraining layer,
   wherein an elasticity modulus of the constraining layer is at least 10 times greater than an elasticity modulus of the damping layer, and
   wherein a thickness of the damping layer is between about 100 µm and 1000 µm.

2. A lithographic apparatus according to claim 1, wherein the viscoelastic material is a viscoelastic polymer layer at least partially extending between the base and the constraining layer and connected thereto with an adhesive.

3. A lithographic apparatus according to claim 2, wherein an elasticity modulus of the adhesive is greater than an elasticity modulus of the damping layer.

4. A lithographic apparatus according to claim 1, wherein the viscoelastic material is a viscoelastic adhesive connecting the base with the constraining layer.

5. A lithographic apparatus according to claim 1, wherein the base is covered by the damping layer, or the constraining layer, or both the damping layer and the constraining layer.

6. A lithographic apparatus according to claim 1, wherein the base, or the constraining layer, or both the base and the constraining layer are made from glass or ceramic.

7. A lithographic apparatus according to claim 1, wherein the constraining layer includes cuts arranged in a periphery of the constraining layer.

8. A lithographic apparatus according to claim 1, wherein both the damping layer and the constraining layer are segmented.

9. A lithographic apparatus according to claim 1, wherein the damping layer, or the constraining layer, or both the damping layer and the constraining layer cover more than half of the area of the chuck that shows high strain at a mode shape to be damped.

10. A lithographic apparatus according to claim 1, wherein the base is constructed as a box with internal ribs.

11. A lithographic apparatus according to claim 1, wherein the object is the patterning device and the chuck is configured to hold and position the patterning device onto the patterning device support.

12. A lithographic apparatus according to claim 1, wherein the object is the substrate and the chuck is configured to hold and position the substrate onto the substrate table.

13. A lithographic apparatus according to claim 1, wherein a thickness of the constraining layer is between about 0.5 mm and 5 mm.

14. A lithographic apparatus according to claim 1, wherein the at least two detached segments include a first, second and third segments, and wherein the first segment is separated from the second segment along a first direction and the first segment is separated from the third segment along a second direction that is different from the first direction.

15. A lithographic apparatus according to claim 1, wherein the damping layer is arranged between two separate constraining layers.

16. A chuck configured to hold and position an object, the chuck comprising:
   a base and a constraining layer, and
   a damping layer comprising a viscoelastic material and provided between the base and the constraining layer, wherein at least one of the damping layer and constraining layer is segmented in a plane thereof to form at least two detached segments in said at least one of the damping layer and the constraining layer,
   wherein an elasticity modulus of the constraining layer is at least 10 times greater than an elasticity modulus of the damping layer, and
   wherein a thickness of the damping layer is between about 100 μm and 1000 μm.

17. A chuck according to claim 16, wherein the object is a patterning device configured to pattern a radiation beam.

18. A chuck according to claim 16, wherein the object is a substrate configured to be exposed by a radiation beam.

19. A chuck according to claim 16, wherein the viscoelastic material is a viscoelastic polymer layer at least partially extending between the base and the constraining layer and connected thereto with an adhesive.

20. A chuck according to claim 16, wherein the viscoelastic material is a viscoelastic adhesive connecting the base with the constraining layer.

21. A chuck according to claim 16, wherein the base is covered by the damping layer, or the constraining layer, or both the damping layer and the constraining layer.

22. A chuck according to claim 16, wherein both the base and the constraining layer are made from glass or ceramic.

23. A chuck according to claim 16, wherein the at least two detached segments include a first, second and third segments, and wherein the first segment is separated from the second segment along a first direction and the first segment is separated from the third segment along a second direction that is different from the first direction.

24. A lithographic apparatus comprising:
   a patterning device support constructed to support a patterning device, the patterning device being capable of imparting a radiation beam with a pattern in a cross-section of the radiation beam to form a patterned radiation beam;
   a substrate table constructed to hold a substrate;
   a projection system configured to project the patterned radiation beam onto a target portion of the substrate;
   a chuck configured to hold and position an object, the chuck comprising a base and a constraining layer, and
   a damping layer comprising a viscoelastic material and provided between the base and the constraining layer, wherein the damping layer is constructed and arranged to damp global bending modes or local bending modes of the chuck, or both the global bending modes and the local bending modes of the chuck, and
   wherein a thickness of the damping layer is between about 100 μm and 1000 μm.

25. A lithographic apparatus according to claim 24, wherein a thickness of the constraining layer is between about 0.5 mm and 5 mm.

* * * * *